(12) United States Patent
Hong

(10) Patent No.: US 6,218,231 B1
(45) Date of Patent: Apr. 17, 2001

(54) METHODS FOR FABRICATING HIGH DIELECTRIC CAPACITORS OF SEMICONDUCTOR DEVICES

(75) Inventor: Kwon Hong, Ichonshi (KR)

(73) Assignee: Hyundai Electronics Industries Co., Ltd. (KR)

( * ) Notice: Subject to any disclaimer, the term of this patent is extended or adjusted under 35 U.S.C. 154(b) by 0 days.

(21) Appl. No.: 09/221,623

(22) Filed: Dec. 28, 1998

(30) Foreign Application Priority Data

Dec. 27, 1997 (KR) .................................................. 97-75088

(51) Int. Cl.$^7$ ................................................. H01L 21/8234
(52) U.S. Cl. ........................... 438/238; 438/239; 438/253; 438/254; 438/260; 437/253
(58) Field of Search ...................... 438/238, 239, 438/253, 254, 260; 437/253

(56) References Cited

U.S. PATENT DOCUMENTS

| | | | |
|---|---|---|---|
| 5,046,043 | 9/1991 | Miller et al. | 364/145 |
| 5,506,166 * | 4/1996 | Sandhu et al. | 437/60 |
| 5,508,953 | 4/1996 | Fukuda et al. | 365/145 |
| 5,510,651 | 4/1996 | Maniar et al. | 257/751 |
| 5,523,595 | 6/1996 | Takenaka et al. | 257/295 |
| 5,555,486 | 9/1996 | Kingon et al. | 361/305 |
| 5,645,976 | 7/1997 | Azuma | 430/313 |
| 5,744,832 | 4/1998 | Wolters et al. | 257/295 |
| 5,918,120 * | 6/1999 | Huang | 438/239 |
| 5,918,123 * | 6/1999 | Yang | 438/253 |
| 6,066,528 * | 5/2000 | Fazan et al. | 438/253 |

FOREIGN PATENT DOCUMENTS

| | | | |
|---|---|---|---|
| 05136788 | 5/1993 | (JP) | H01L/27/108 |
| 05316209 | 12/1993 | (JP) | H01L/21/8242 |
| 08133030 | 5/1996 | (JP) | H01L/27/108 |
| 08166527 | 6/1996 | (JP) | H01L/27/108 |
| 08243745 | 9/1996 | (JP) | H01L/27/108 |
| 09016103 | 1/1997 | (JP) | H01L/21/60 |

* cited by examiner

Primary Examiner—Vu A. Le
Assistant Examiner—Pho Luu
(74) Attorney, Agent, or Firm—Blakely, Sokoloff, Taylor & Zafman

(57) ABSTRACT

Provided is a method for fabricating a high dielectric capacitor of a semiconductor device without decreasing the properties of the dielectric under oxygen atmosphere in the process for depositing a high dielectric thin film at high temperature and the thermal treatment process for the crystallization of the dielectric. By using the hybrid electrode of the IrO$_2$ film and the Pt or Ir film together with properties of diffusion barrier and bottom electrode, the present invention can enhance the thermal stability of the bottom electrode and, thus, fabricate a capacitor with excellent properties through stabilization of the processes for forming the high dielectric film.

4 Claims, 2 Drawing Sheets

METHODS FOR FABRICATING HIGH DIELECTRIC CAPACITORS OF SEMICONDUCTOR DEVICES

FIELD OF THE INVENTION

The present invention relates to a technology in the field of fabricating semiconductor devices; and, more particularly, to methods for fabricating high dielectric capacitors applied to super-large-scale-integrated DRAMs and FeRAMs.

DESCRIPTION OF THE PRIOR ART

According to high integration of semiconductor memory devices such as dynamic random access memory (DRAM), the operation properties of semiconductor devices such as refresh property have been attended as a primary thing. Therefore, in order to obtain the suitable operation properties, the researches and developments for obtaining the sufficient static capacitance of capacitors have been undergoing.

Typical capacitors in the prior art using the dielectric films of nitric oxide (NO) and tantalum oxide ($Ta_2O_5$), have a bottom electrode of three-dimensional structure or a ferroelectric film with decreased thickness in order to provide the static capacitance enough to obtain their operational properties. However, the structure of the capacitors in the prior art has been faced with difficulty to apply to high integration of semiconductor devices.

Therefore, high dielectric capacitors using thin films of high dielectric materials with dielectric constant of more than 7 such as strontium titanate $SrTiO_3$, $(Ba,Sr)TiO_3$ (hereinafter, referred to as barium strontium titanate (BST)), $Pb(Zr,Ti)O_3$ (hereinafter, referred to as lead zirconate titanate (PZT)) have been researched and developed in order to use as capacitors of DRAM and post-generation semiconductor memory devices in the future.

In these high dielectric capacitors, a film of platinum (Pt), ruthenium dioxide ($RuO_2$), iridium (Ir), or iridium dioxide ($IrO_2$) are applied as a bottom electrode with a film of diffusion barrier for preventing diffusion of polysilicon plup. As a film of diffusion barrier to a bottom electrode, a film of titanium nitride (TiN) is generally used. There are, however, drawbacks that the film of TiN is easily oxidized under oxygen atmosphere in the process for depositing high dielectric material at high temperature and in the thermal treatment process for crystallization of the high dielectric material, to form a thin film of titanium dioxide ($TiO_2$) and thus to greatly decrease the properties of the dielectric.

SUMMARY OF THE INVENTION

It is, therefore, an object of the present invention to provide a method for fabricating a high dielectric capacitor of a semiconductor device without decreasing the properties of the dielectric under oxygen atmosphere in the process of depositing a high dielectric thin film at high temperature and in the thermal treatment process for the crystallization of the dielectric.

In accordance with one embodiment of the present invention, there is provided a method for fabricating a high dielectric capacitor of a semiconductor device which comprises the steps of: forming a film of $IrO_2$ electrically connected to a semiconductor substrate on which a predetermined lower layer is formed; forming a film of Pt (or Ir) on the film of $IrO_2$; selectively etching the films of Pt (or Ir) and $IrO_2$ to define a bottom electrode; forming a thin film of high dielectric material over the entire structure; and forming an upper electrode on the thin film of high dielectric material.

Using the hybrid electrode of the $IrO_2$ film and the Pt (or Ir) film together with properties of diffusion barrier and bottom electrode, the present invention can enhance the thermal stability of the bottom electrode and, thus, fabricate the capacitor with excellent properties through stabilization of the processes for forming the high dielectric film.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

The invention will be illustrated in detail by the following preferred embodiments with reference to the accompanying drawings.

Figure 1:
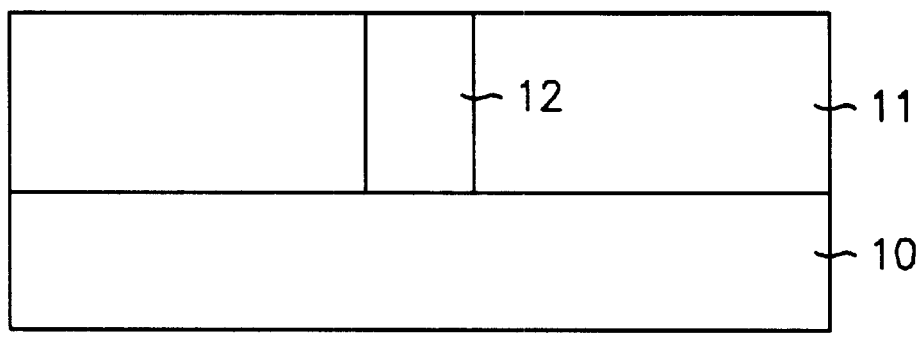
FIG. 1 through FIG. 4 depicts, schematically, various steps in the fabrication of a high dielectric capacitor according to one preferred embodiment of the invention.
Figure 2:
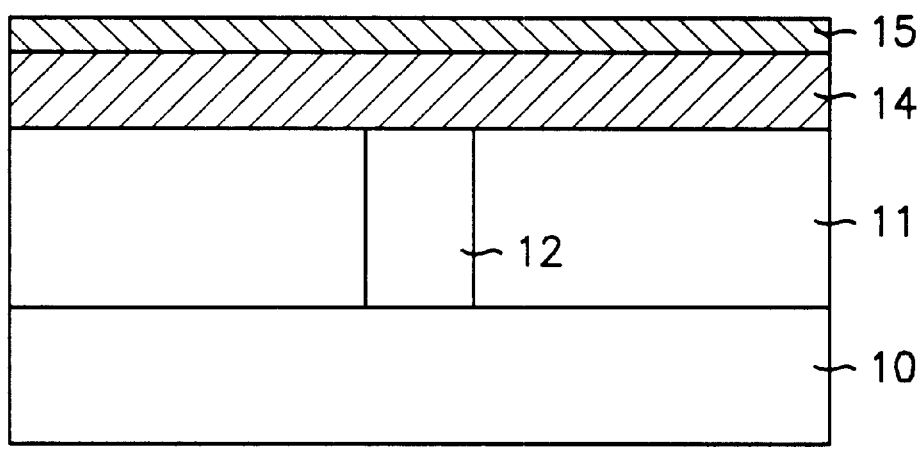

First, referring to FIG. 1, a film of inter-layer insulating material 11 is deposited on a silicon substrate 10 and selectively etched to form a contact hole for the connection of a bottom electrode in a capacitor. A film of polysilicon is deposited to a thickness of about 500 to 3000 Å over the entire structure by chemical vapor deposition (CVD) to be buried in the contact hole. Using chemical mechanical polishing or entire etching, the film of polysilicon is etched back to form a polysilicon plug 12. Next, referring to FIG. 2, the natural oxide (not shown) is removed through a cleaning process, Subsequently, in order to depress mutual-diffusion between silicon and platinum (or iridium), a film of iridium dioxide ($IrO_2$) 14, which is excellent in the property of diffusion barrier, is deposited over the entire structure to a thickness of about 1000 to 1500 Å by direct current (DC) reactive sputtering. A film of platinum (Pt) (or Ir) 15 is then deposited to a thickness of about 1000 to 5000 Å by sputtering. The film of Pt (or Ir) is a bottom electrode greatly affecting properties of a high dielectric thin film.

Figure 3:
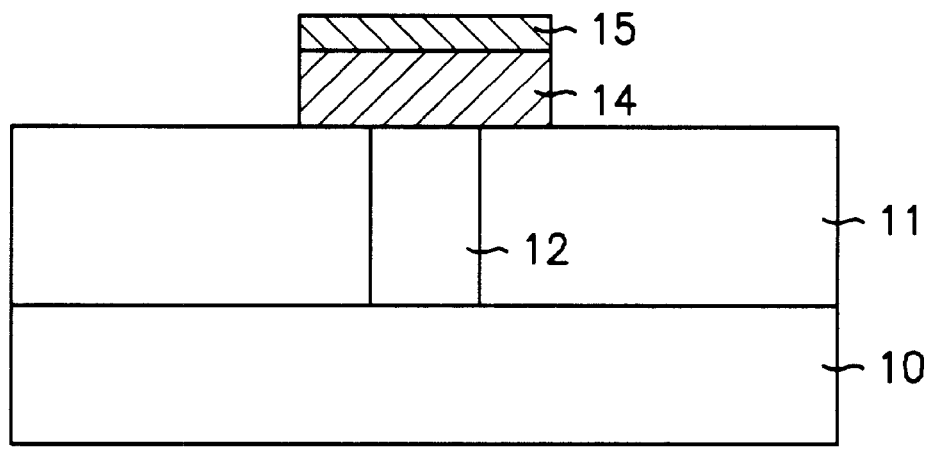

Subsequently, referring to FIG. 3, performing processes of photoresist and dry etching, the films of Pt 15 and $IrO_2$ 14 are patterned and designed as a bottom electrode.

Figure 4:
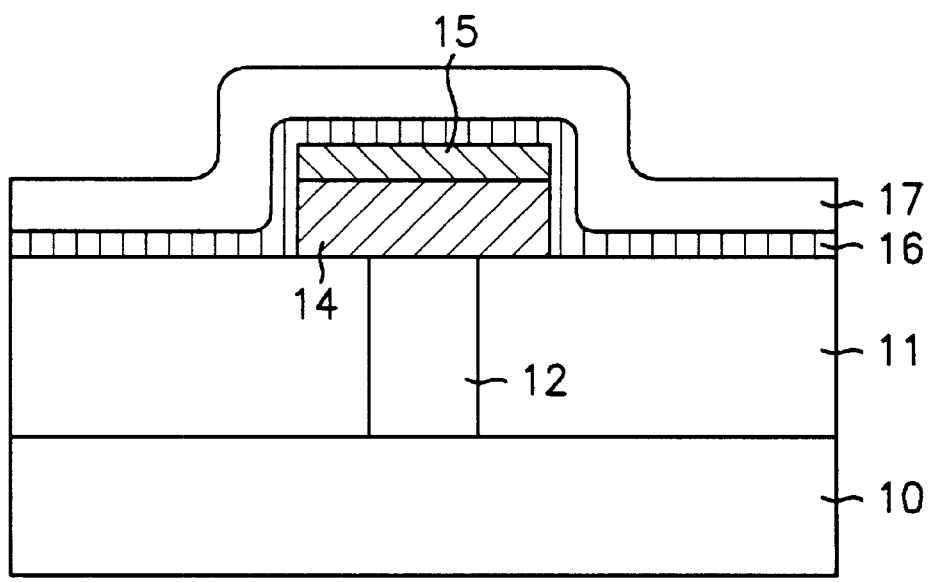

Finally, referring to FIG. 4, using physical vapor deposition (PVD) or chemical vapor deposition (CVD), a thin film of barium strontium titanate (BST) 16 as a high dielectric film is deposited to a thickness of about 300 to 2000 Å and crystallized by a process of thermal treatment. A film of Pt (or Ir) 17 is deposited to a thickness of about 500 to 2000 Å. Forwardly, processes of photoresist and dry etching are proceeded to form a high dielectric capacitor.

In the above-described preferred embodiment, processes for a simple stack type capacitor using a contact plug are described as an example. However, the invention may be applied to processes for the other type capacitors since the invention is characterized in construction of the hybrid bottom electrode.

While the present invention has been described with respect to certain preferred embodiments only, other modifications and variations may be made without departing from the spirit and scope of the present invention as set forth in the following claims.

What is claimed is:

1. A method for fabricating a high dielectric capacitor of a semiconductor device which comprises the steps of:

forming a film of iridium dioxide ($IrO_2$) electrically connected to a semiconductor substrate on which a predetermined lower layer is formed;

forming a film of platinum (Pt) on the film of $IrO_2$;

selectively etching the films of Pt and $IrO_2$ to define a bottom electrode;

forming a thin film of high dielectric material over the entire structure; and forming an upper electrode on the thin film of high dielectric material.

2. The method according to claim 1, wherein the thickness of the film $IrO_2$ and the film of Pt are 500 to 1000 Å and 1000 to 5000Å, respectively.

3. A method for fabricating a high dielectric capacitor of a semiconductor device which comprises the steps of:

forming a film of $IrO_2$ electrically connected to a semiconductor substrate on which a predetermined lower layer is formed;

forming a film of iridium (Ir) on the film of $IrO_2$;

selectively etching the films of Ir and $IrO_2$ to define a bottom electrode;

forming a thin film of high dielectric material over the entire structure; and forming an upper electrode on the thin film of high dielectric material.

4. The method according to claim 3, wherein the thickness of the film $IrO_2$ and the film of Ir are 500 to 1000 Å and 1000 to 5000Å, respectively.

* * * * *